METHOD FOR FABRICATING INSULATED-GATE FIELD-EFFECT TRANSISTORS

Filed May 21, 1965

INVENTORS
FRANK F. FANG
EDWARD J. WALKER
HWA N. YU

BY S. P. Tedesco
ATTORNEY

United States Patent Office 3,417,464
Patented Dec. 24, 1968

3,417,464
METHOD FOR FABRICATING INSULATED-GATE FIELD-EFFECT TRANSISTORS

Frank F. Fang, Yorktown Heights, Edward J. Walker, Ossining, and Hwa N. Yu, Yorktown Heights, N.Y., assignors to International Business Machines Corporation, Armonk, N.Y., a corporation of New York Filed May 21, 1965, Ser. No. 457,571
20 Claims. (Cl. 29—571)

ABSTRACT OF THE DISCLOSURE

The threshold voltage or operational mode, as desired, of an insulated-gate field effect transistor is tailored by doping the surface of the conduction channel prior to the gate electrode metallization with a particular acceptor-type impurity, e.g., gallium, to control the density of donor states at the semiconductor-insulating layer, e.g., silicon-silicon dioxide, interface. The acceptor-type impurity is diffused through the insulating layer and subsequent to all high temperature processes to achieve positive control of the operational characteristics. A sufficient doping level of the acceptor-type impurity can change irreversibly the operational mode of the field effect transistor.

This invention relates to methods for fabricating insulated-gate field-effect transistors and, more particularly, to improved fabricating methods for tailoring the operating characteristics of insulated-gate field-effect transistors.

At the present time, much effort is being directed toward the development of techniques for batch-fabricating large numbers of microminiaturized solid-state circuit devices along with functional interconnections on a single substrate. By this development, it is hoped that certain problems resulting from the increased complexity of present day electronic systems and, also, the objectionable high cost of fabricating the same can be overcome. The objective of such development is to reduce the size, weight, and unit cost of the solid-state circuit devices and, also, to improve reliability, speed, and power utilization from the system viewpoint.

Numerous solid-state circuit devices suitable for batch-fabrication have been described in the scientific literature. For example, one such device is the insulated-gate field-effect transistor. Basically, a field-effect transistor comprises a metallic gate electrode spaced from the surface of a suitably-doped semiconductor body of first conductivity type by a thin layer of dielectric material; in addition, source and drain electrodes are defined by spaced surface portions of opposite conductivity type in the semiconductor body. Electrical fields generated by the gate electrodes modulate carrier density along the surface, or conduction channel, the semiconductor body, and therefore, conduction between source and drain electrodes. The field-effect transistor, being a voltage control device, is more nearly the equivalent of a vacuum tube triode than of a conventional transistor device.

Present day batch-fabrication efforts, based somewhat on known semiconductor technology, intend that large numbers of field-effect transistors, either NPN or PNP, are concurrently formed in a semiconductor body, e.g., a silicon wafer. The silicon wafer forms a constituent part of each field-effect transistor, i.e. defines the conduction channel, and, also, provides appropriate support therefor. Certain limitations, however, are inherent in present day fabrication techniques. For example, field-effect transistors fabricated concurrently on a same silicon wafer exhibit a same operational mode. More particularly, NPN field-effect transistors exhibit depletion mode operation, i.e., substantial source-drain current $I_{sd}$ flows at zero-gate bias; on the other hand, PNP field-effect transistors exhibit enhancement mode operation, i.e. negative-gate bias is necessary to draw substantial source-drain current $I_{sd}$. Accordingly, NPN field-effect transistors are normally "on" devices and PNP field-effect transistors are normally "off" devices. Also, each field-effect transistor formed on the silicon wafer exhibits a same threshold voltage $V_t$.

From a logic circuit point of view, enhancement mode operation as exhibited by PNP field-effect transistors is preferred since it allows direct coupling between the individual circuit elements. NPN-type field-effect transistors are of particular interest since they exhibit a higher carrier mobility $\mu$ than do PNP-type field-effect transistors. Accordingly, from a design point of view, an NPN-type field-effect transistor exhibiting enhancement mode operation and, also, the ability to control, or tailor, the threshold voltage $V_t$ applied to the gate electrode to draw useful source-drain current $I_{sd}$ is very much desired. For example, field-effect transistors, whether NPN or PNP, exhibiting depletion mode operation are preferred as constant-current load devices whereas those exhibiting enhancement mode operation are preferred as active elements in a circuit arrangement. Selective biasing techniques heretofore suggested to obtain both depletion and enhancement mode operation in field-effect transistors of a same type on a same silicon wafer are cumbersome. Also, suggested biasing of the silicon wafer not only precludes selectivity but also introduces a common voltage-shift which affects the operation of each of the field-effect transistors.

The characteristic operational modes exhibited by NPN and PNP field-effect transistors, respectively, are due to an excess of donor surface states along the conduction channel which results from the character of the silicon-silicon dioxide insulation interface. In the NPN field-effect transistor, these donor surface states can cause an ohmic conduction path (inversion layer) between the source and drain electrodes. Similarly, in the PNP field-effect transistor, these donor surface states define a higher resistivity conduction path (accumulation layer) between the source and drain electrodes whereby increased negative-gate bias is required to draw useful source-drain current $I_{sd}$. The metallurgical problem of forming a plurality of field-effect transistors in operative arrangement on a silicon wafer would be greatly simplified if the operating characteristics of such devices could be tailored in accordance with circuit requirements. Such tailoring is achieved in accordance with this invention by a controlled compensation of donor surface states at the silicon surface to produce a more p-type surface, such compensation being effected in a manner which does not complicate an already complicated fabrication process.

Accordingly, an object of this invention is to provide a novel method for fabricating field-effect transistors.

Another object of this invention is to provide a novel method for tailoring the operating characteristics of field-effect transistors.

Another object of this invention is to provide field-effect transistors exhibiting enhancement mode and depletion mode operation on a single semicondutcor wafer.

Another object of this invention is to provide a novel method for determining, on an individual basis, the operational modes of a plurality of same type field-effect transistors formed on a semiconductor wafer.

Another object of this invention is to provide a novel method for controlling the effect of donor surface states at a semiconductor-insulator interface.

Conduction in a field-effect transitsor is primarily a surface mechanism since carrier flow between source and drain electrodes is effected along a thin narrow surface portion of the silicon wafer at the semiconductor-insulator interface. As hereinabove described, the denstiy of the donor surface states on the silicon surface is a primary determinant of the operating characteristics of the field-effect transistor. Numerous attempts are evidenced in the prior art for controlling the density of donor surface states on the silicon surface, or along the conduction channel of field-effect transistors. For example, such attempts have included thermal treatments between 100° C. and 150° C. which served only to mitigate but do not provide positive control over the operating characteristics of the field-effect transistors. Moreover, such treatments affect all field-effect transistors on the silicon wafer such that tailoring of the operating characteristics of such devices on an individual basis is precluded. Also, and as described in copending patent application Ser. No. 392,144, filed on Aug. 26, 1964 in the name of A. E. Brennemann et al. and assigned to a common assignee, the operating characteristics of field-effect transistors are tailored by introducing negatively-charged impurities into the insulating silicon dioxide layer.

In accordance with the present invention, the density of donor surface states at the silicon-silicon dioxide interface is precisely controlled by doping the narrow surface portion of the silicon wafer defining the conduction channel of the field-effect transistor with an appropriate acceptor impurity, such doping being effected through the silicon dioxide layer so as not to unnecessarily complicate the fabrication process. The presence of the acceptor impurity along the narrow surface portion of the semiconductor wafer effectively reduces the density of donor surface states, i.e., the surface potential, at the silicon-silicon dioxide interface. By controlling the doping level of the silicon surface, the operating characteristics of the field-effect transistor, e.g., the threshold voltage $V_t$, can be tailored; also, a sufficient doping level can irreversibly convert the operational mode of the field-effect transistor. The acceptor impurity, however, is purposefully selected so that the presence of a small concentration of such impurity in the silicon dioxide insulating layer does not have a deleterious effect on the surface conduction mechanism.

Generally, a genetically-formed layer of silicon dioxide is employed as the insulating layer in a silicon field-effect transistor. It has been reported that silicon dioxide can act as a selective mask against the diffusion of certain dopant materials into a silicon surface. For example, "Surface Protection and Selective Masking During Diffusion in Silicon," by C. J. Frosch et al., Journal of the Electrochemical Society, September 1957, pages 547 through 552, describes the diffusion masking effectiveness of silicon dioxide against several donor and acceptor impurities into silicon.

An acceptor impurity suitable for the practice of this invention is ideally characterized as having a high diffusion constant $D_{Si}$, approaching infinity, through the silicon dioxide layer, a low diffusion constant $D_{SiO_2}$, approaching zero, in the silicon material whereby only the narrow surface portion is doped, and exhibiting a high segregation constant *m*, approaching infinity, at the silicon-silicon dioxide interface whereby a large percentage of impurity atoms pass through the silicon-silicon dioxide interface and into the semiconductor material. Segregation constant m, is defined as $C_{Si}/C_{SiO_2}$, where $C_{Si}$ and $C_{SiO_2}$ represent the impurity concentration on the silicon and silicon dioxide surfaces, respectively, defining an interface.

In accordance with the described method of this invention, the operating characteristics of a field-effect transistor are irreversibly controlled by diffusing a controlled quantity of gallium (Ga) through the silicon dioxide layer and into the surface of the silicon wafer defining the conduction channel. A thin layer of silicon dioxide is essentially transparent to gallium at elevated temperatures, e.g., in excess of 650° C. The degree of doping of the narrow surface portion of the silicon material depends upon system parameters, for example, diffusion temperature $T_d$, diffusion time $t_d$, surface concentration $C_o$ of gallium (Ga) on the silicon dioxide layer, the thickness *d* of the silicon dioxide layer, the segregation coefficient *m* at the silicon-silicon dioxide interface, etc. In the practice of this invention, system parameters are purposefully chosen such that only the narrow surface portion of the silicon wafer is doped to determine a desired threshold voltage $V_t$, and, also, establish a predetermined operational mode for the field-effect transistor.

In the practice of this invention, gallium is a particularly suitable acceptor impurity since it exhibits a high diffusion constant $D_{SiO_2}$ in silicon dioxide, e.g., $10^{-15}$ cm.$^2$/sec., at 800° C.; the diffusion constant $D_{Si}$ in silicon is an order of magnitude lower, e.g., $10^{-16}$ cm.$^2$/sec., at 800° C. Also, gallium exhibits a segregation constant *m* at the silicon-silicon dioxide interface of about 20 whereby significant doping of the narrow surface portion of the silicon material is achieved while contamination of the silicon dioxide layer is minimal. More significantly, the effects of gallium remaining in the silicon dioxide layer and passing into the source and drain diffusions are minimal, the primary effect being the doping of the silicon surface to compensate the donor surface states. The structure of the field-effect transistor can then be completed by deposition of the gate electrode over the silicon dioxide layer and registered with the conduction channel defined between the source and drain diffusions.

In accordance with a more particular aspect of this invention, field-effect transistors of a same structural type can be formed on a silicon material to exhibit selected operational modes, i.e., enhancement or depletion. For example, as hereinafter described, NPN field-effect transistors are fabricated by conventional techniques on a silicon wafer and normally exhibit depletion mode operation. As described, portions of the silicon dioxide diffusion mask over portions of the silicon material defining conduction channels of the NPN field-effect transistors to be converted to enhancement mode operation are stripped and the structure subjected to a short oxidation process. Accordingly, the silicon dioxide layer is preformed such that a lesser thickness is provided over selected areas corresponding to conduction channels of particular field-effect transistors. System parameters are then selected such that the gallium penetrates only through the thinner portions and is effectively masked by the thicker portions of the silicon dioxide layer. Accordingly, portions of the silicon surface defining the conduction channels of the particular field-effect transistors are compensated to change the threshold voltage $V_t$ or alter the operational mode of such devices as desired. Portions of the silicon surface masked by the greater thickness of silicon dioxide layer and defining the conduction channels of remaining field-effect transistors are substantially unaffected.

The foregoing and other objects, features, and advantages of the invention will be apparent from the following more particular description of preferred embodiments of the invention, as illustrated in the accompanying drawings.

Figures 1, 2:
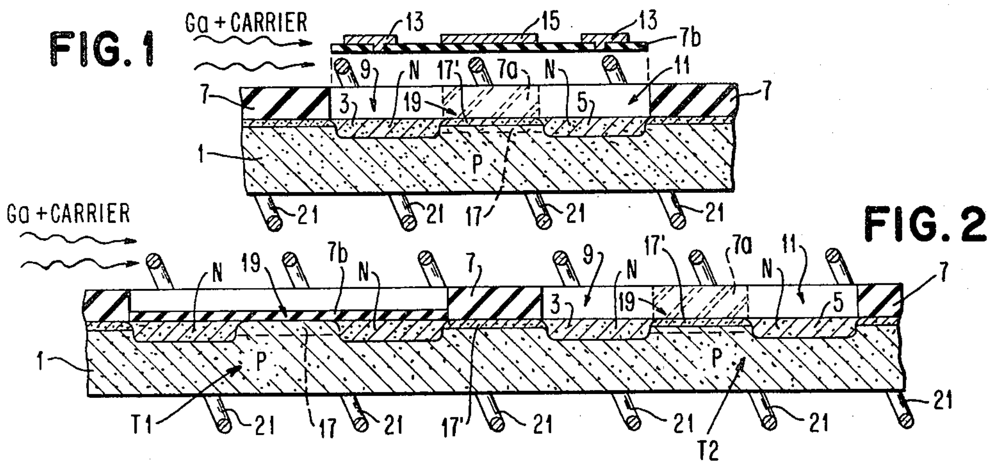
FIG. 1 is a cross-sectional view of a field-effect transistor structure useful in describing the method of this invention.
FIG. 2 is a cross-sectional view of a number of field-effect transistor structures formed on a single semiconductor wafer and useful in describing a selective tailoring of the respective operating characteristics in accordance with the method of this invention.

Referring to FIG. 1, an NPN insulated-gate field-effect transistor is illustrated as comprising a planar p-type silicon wafer 1 of relatively high resistivity and having diffused spaced portions 3 and 5 of n-type conductivity defining source and drain electrodes, respectively. Source and drain electrodes 3 and 5 normally define rectifying junctions with silicon wafer 1. An insulating layer 7 is formed genetically over the entire surface of wafer 1 and is used for masking purposes during the diffusion of n-type dopant to define source and drain electrodes 3 and 5. For example, the insulating layer 7 can be formed of thermally grown silicon dioxide ($SiO_2$) prepared by exposing wafer 1 at 1250° C. to an atmosphere of either oxygen ($O_2$), oxygen and water vapor ($O_2+H_2O$), or carbon dioxide ($CO_2$) for a time sufficient to be formed in a thickness of approximately 6,000 A. When insulating layer 7 has been formed, appropriate openings 9 and 11 are cut by suitable photolithographic processes to provide "diffusion windows" over portions of wafer 1 wherein source and drain electrodes 3 and 5 are to be diffused. For example, an appropriate photoresist material can be formed over insulating layer 7 and reacted, for example, photolytically or by particle irradiation, over all portions except where the diffusion process is to be effected. The photoresist material is then washed with appropriate solvent to remove unreacted photoresist materials and expose selected surface areas of the insulating layer 7. A suitable silicon dioxide etchant, e.g., hydrofluoric acid (HF), is employed to etch diffusion windows 9 and 11. With insulating layer 7 acting as a diffusion mask, wafer 1 is heated at temperatures ranging between 1100° C. and 1250° C. by heater element 21 in a reactive atmosphere, for example, of phosphorus pentoxide ($P_2O_5$), to form source and drain electrodes 3 and 5. In practice, insulating layer 7 can serve the additional function of providing electrical isolation between wafer 1 and metallic thin film conductors 13 for interconnecting various field-effect transistors. As hereinafter described, both conductors 13 and gate electrode 15 are formed by conventional chemical etching processes. When formed, the gate electrode 15 is registered in electrical field-applying relationship with that portion of wafer 1 defining conduction channel 17 betwen spaced source and drain electrodes 3 and 5. In FIG. 1, conductors 13 and gate electrode 15 are shown exploded from insulating layer 7 to indicate that the compensation of the donor surface states is effected at least subsequent to the high temperature oxidation processes for forming insulating layer 7 and prior to the metallization processes for forming conductors 13 and gate electrode 15. Also, portion *7a* of insulating layer 7 is shown in dashed outline to indicate stripping during an intermediate step in the fabrication process.

To more fully appreciate the effects of compensating the surface of water 1 in accordance with this invention, a brief description is given of the particular problem to which this invention is directed. It is known that conduction between source and drain electrodes 3 and 5 is primarily a surface mechanism. In an ideal NPN field-effect transistor as shown in FIG. 1, majority carriers, i.e., holes, are repelled from the silicon-silicon dioxide interface 19 when gate electrode 15 is biased positively; if positive-gate bias is sufficient, the large number of electrons in conduction channel 17 can actually define an ohmic connection (inversion layer) between source and drain electrodes 3 and 5. The effect of excess donor surface states due to the character of the silicon-silicon dioxide interface 19 is identical, as indicated by strata 17' of wafer 1, and reduces the work function of the junctions between such strata and source and drain electrodes 3 and 5, respectively. When an NPN field-effect transistor is fabricated by conventional processes, the work function of the junctions of the strata 17' and source and drain electrodes 3 and 5, respectively, is sufficiently low (substantially ohmic) that a finite current flows between source and drain electrodes 3 and 5 at zero-gate bias (depletion mode). Conversely, in the PNP field-effect transistor, excess donor surface states along strata 17' increases the work function of the junctions between strata 17' and source and drain electrodes 3 and 5, respectively, as to define an accumulation layer whereby a deeper enhancement mode operation results, as hereinabove described. The presence of excess donor surface states along strata 17' results from the character of the silicon-silicon dioxide interface 19 and cannot be avoided in present day fabrication processes except by special treatments as hereinabove indicated.

In accordance with particular aspects of this invention, strata 17' defining an inversion layer in the case of an NPN field-effect transistor and an accumulation layer in the case of a PNP field-effect transistor is appropriately doped to reduce or overcome the effect of the donor surface states and, thus, the surface potential at the silicon-silicon dioxide interface 19. Controlled acceptor doping of strata 17' is effective to control the operating characteristics of the field-effect transistor structure by determining the work function of the junctions therebetween and source and drain electrodes 3 and 5, respectively. Since field-modulated conduction extends a Debye length into wafer 1 after an inversion layer is formed, as indicated by conduction channel 17, acceptor doping of such channel controls the work function therebetween and source and drain electrodes 3 and 5, respectively, whereby the operating characteristics, e.g., threshold voltage $V_t$, can be precisely controlled.

In accordance with the preferred practice of this invention, the acceptor impurity is selected as one having a relatively high diffusion constant $D_{SiO_2}$, a relatively low diffusion constant $D_{Si}$, and a high segregation constant *m* at the silicon-silicon dioxide interface 19. Such characteristics insure that a significant number of acceptor impurity atoms pass through layer 7 and to a short depth within wafer 1. The relatively low diffusion constant $D_{Si}$ loosens, somewhat, diffusion parameters and relaxes diffusion control. In the described method, gallium is a preferred acceptor impurity since it exhibits a diffusion constant $D_{Si}$ of approximately $10^{-16}$ cm.$^2$/sec., a diffusion constant $D_{SiO_2}$ of approximately $10^{-15}$ cm.$^2$/sec., and a segregation coefficient *m* of approximately 20. Generally, the thickness of insulating layer 7 serving as a diffusion mask for source and drain electrodes 3 and 5 is within a thickness range of 6,000 A to 10,000 A. To reduce diffusion time $t_d$, a lesser thickness of silicon dioxide is formed over portions of wafer 1 defining conduction channel 17. Subsequent to the source and drain diffusions 3 and 5, portion *7a* of insulating layer 7 is stripped, e.g., by conventional chemical etching techniques employing hydrofluoric acid (HF). It is noted in FIG. 1 that strata 17' defining excess donor surface states is coextensive with the silicon-silicon dioxide interface 19. If desired, the entire insulating layer 7 can be stripped if the total surface of wafer 1 is to be compensated. Exposed surfaces of wafer 1 are reoxidized to form a silicon dioxide insulating layer *7b* of lesser thickness, e.g., 1,500 A., which extends over source and drain electrodes 3 and 5. As illustrated in FIG. 1, conductors 13 are connected to source and drain electrodes 3 and 5, respectively, by standard techniques.

When thin insulating layer *7b* has been formed, the structure of FIG. 1 is exposed to a gallium atmosphere at elevated temperatures. For example, gallium diffusant can be derived by vaporization of the elemental material or decomposition of a suitable compound form, e.g., gallium trioxide ($Ga_2O_3$), the vapors being transported over the structure of FIG. 1 in an appropriate carrier, e.g., hydrogen, as shown. Alternatively, the gallium diffusion process can be effected in a closed-tube system as well known in the art. While exposed to the gallium atmosphere, wafer 1 is elevated to selected diffusion temperature $T_d$ by appropriate heating element 21, diffusion temperature $T_d$ ranging between 650° C. and 1250° C. and selected in accordance with the time alloted for the diffusion process.

Figure 3A:
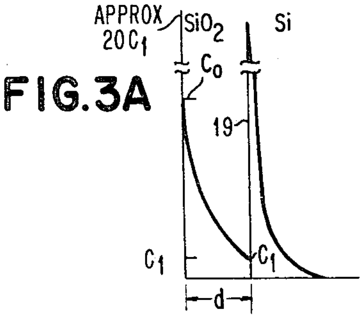
FIG. 3A and 3B are schematic representations of impurity diffusion profiles in the silicon-silicon doixide system, respectively.
Figure 3B:
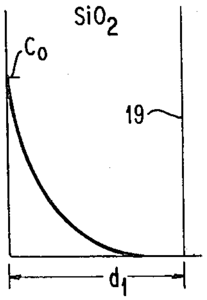

The gallium diffusion process can be understood by reference to FIGS. 3A and 3B which represent diffusion profiles for selected system parameters through thin insulating layer *7b* of thickness *d* into the surface of wafer 1 (silicon-silicon dioxide system) and through thick insulating layer 7 of thickness $d_1$ (silicon dioxide system), respectively. More particularly, FIGS. 3A and 3B, respectively, represent profiles after diffusing a given surface concentration $C_o$ of gallium at 800° C. for two hours. System parameters are preferably selected such that gallium diffuses, at least, through thin insulating layer *7b* and into the surface of wafer 1, as shown, in FIG. 3A; such system parameters and/or thickness $d_1$ can be selected either to pass or not pass the gallium through thick insulating layer 7, the latter being illustrated in FIG. 3B. Due to the large diffusion constant $D_{SiO_2}$, thin layer *7b* is readily transparent to the gallium atoms. Gallium atoms arriving at silicon-silicon dioxide interface 19 of FIG. 3A, due to the large segregation constant *m* easily pass across such interface as indicated in FIG. 3A to compensate donor surface states and produce a more p-type surface on wafer 1. Thick insulating layer 7 of thickness $d_1$, as illustrated in FIG. 3B, serves as an effective diffusion mask; the presence of gallium atoms in thick insulating layer 7 appears to have minimal effect on the surface of wafer 1. It is evident that the relative thicknesses of insulating layers 7 and *7b* can be determined to provide a desired tailoring of the field-effect transistor and, at the same time, compensate surfaces of wafer 1 adjacent layer 7. In such event, the diffusion profile through thick insulating layer 7 would approximate that of FIG. 3A, the number of gallium atoms passing through interface 19 and into the surface of wafer 1 being sufficient to provide a desired level of compensation of such surface.

Figure 4A:
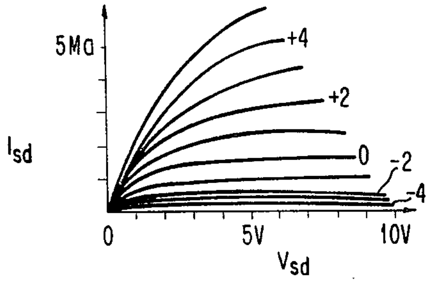
FIG. 4A and 4B illustrates source-drain current ($I_{sd}$), source-drain voltage ($V_{sd}$) characteristics for various values of gate voltage $V_g$ before and after, respectively, compensation of the donor surface states by the method of this invention.
Figure 4B:
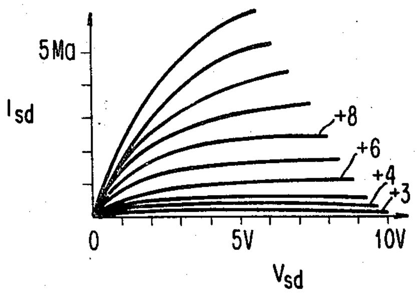
Figures 5A, 5B:
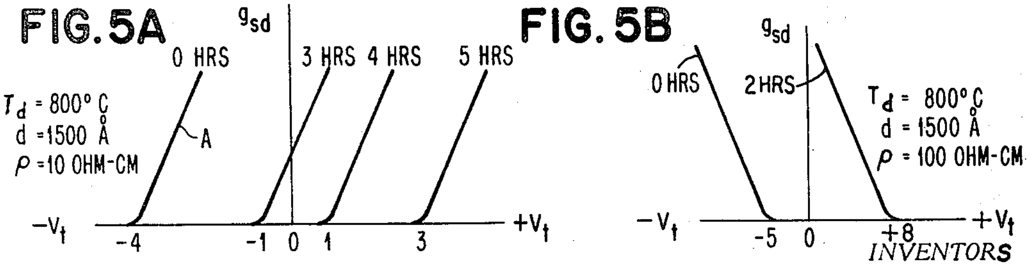
FIG. 5A and 5B illustrates conductance $g_{sd}$ plotted against threshold voltage $V_t$ of NPN and PNP field-effect transistors, respectively, to indicate the effects of compensation of donor surface states on the operating characteristics of field-effect transistors.

Controlled compensation of the surface of wafer 1 is effective to continuously vary the operating characteristics of the field-effect transistor between the distinct operational modes. For example, FIG. 4A illustrates a plot of source-drain current $I_{sd}$ against source-drain voltage $V_{sd}$ for various levels of gate-bias voltage $V_g$ of an uncompensated NPN field-effect transistor fabricated in accordance with prior art processes. As shown in FIG. 4A, such field-effect transistor exhibits a threshold voltage of −4 volts. Also, as illustrated in FIG. 5A wherin conductance $g_{sd}$ is plotted against gate voltage $V_g$, the operation of such transistor is represented by curve A. The curves of FIG. 5A, somewhat idealized, indicate the effects to be achieved by controlled compensation of wafer 1 as achieved by varying a single diffusion parameter, e.g., diffusion time $t_d$ while maintaining diffusion temperature $T_d$ constant. Alternatively, diffusion temperature $T_d$ can be varied while maintaining diffusion time $t_d$ so as to achieve a similar family of curves. The curves of FIG. 5A represent the results of gallium diffusion into wafer 1 having a resistivity of 10 ohm-cm. through thin insulating layer *7b* of 1,500 A.; the diffusion temperature $T_d$ was maintained constant at 800° C. while diffusion time $t_d$ was varied in one hour increments. As indicated, for a diffusion time between 0 through 5 hours, the threshold voltage $V_t$ of the NPN field-effect transistor of FIG. 1 is varied continuously and irreversibly from −4 volts (depletion mode) to +3 volts (enhancement mode). Accordingly, the plot of source-drain current $I_{sd}$ against source-drain voltage $V_{sd}$ of a compensated NPN field-effect transistor in accordance with this invention is shown in FIG. 4B. It is to be noted that the threshold voltage $V_t$ is reduced to zero after a diffusion time $t_d$ of approximately 3½ hours and the operational mode of the NPN field-effect transistors is converted irreversibly from depletion to enhancement mode operation.

Compensation of a PNP field-effect transistor in accordance with this invention is illustrated in FIG. 5B. An uncompensated PNP field-effect transistor fabricated in accordance with prior art processes generally exhibits enhancement mode operation and a threshold voltage $V_t$ of approximately −5 volts for a 100 ohm-cm. n-type substrate. As hereinabove described, threshold voltage $V_t$ can be varied continuously and irreversibly from −5 volts (enhancement mode) to approximately +8 volts (depletion mode) by controlled compensation of the surface of wafer 1 defining conduction channel 17 at a diffusion temperature $T_d$ of 800° C. for diffusion time $t_d$ ranging up to 2 hours.

As descrbed, the surface compensation process is purposefully effected through the silicon dioxide insulating layer 7 in lieu of direct diffusion into wafer 1 prior to the high temperature oxidation processes forming the layer 7. Such sequence serves a dual purpose. Firstly, it prevents out-diffusion of gallium atoms from wafer 1 into and through insulating layer 7 as the latter is being formed during the high temperature oxidation process, e.g., in excess of 1100° C. Since gallium exhibits a relatively high diffusion constant $D_{SiO_2}$, a substantial number of gallium atoms would out-diffuse from the wafer 1 and through insulating layer 7. Accordingly, the narrow strata 17' of wafer 1 would be depleted and the density of donor surface states at interface 19 would not be substantially reduced. In other words, if surface compensation of wafer 1 were effected prior to the oxidation of insulating layers 7 and *7b*, the high oxidation temperatures would draw gallium from the surface of wafer 1 and through the silicon dioxide layer so as to reform the inversion layer, or strata 17', intended to be compensated. Such procedure would materially reduce the effectiveness of the surface compensation and render controlled compensation difficult to achieve. Secondly, high oxidation temperatures would "drive-in" the gallium atoms further into the bulk of wafer 1. Accordingly, junctions defined between these undesirable deeper portions of wafer 1 and source and drain electrodes 3 and 5, respectively, are subject to increased electrical fields and, accordingly, the voltage breakdown of such junctions is correspondingly reduced. Therefore, the magnitude of source-drain voltage $V_{sd}$ applied across source and drain electrodes 3 and 5 is correspondingly limited as well as the allowable swing of gate voltage $V_g$. Compensation of the surface of wafer 1 subsequent to high temperature oxidation processes avoids these effects of "out-diffusion" and, also, "drive-in" of the acceptor-type gallium atoms, as hereinabove described.

In accordance with more particular aspects of this invention, any number of field-effect transistors formed on a same silicon wafer 1 can be individually tailored so as to satisfy particular circuit considerations. One such technique is illustrated in FIG. 2 wherein similar reference characters have been employed; conductors 13 and gate electrode 15 have been purposely omitted. As shown, any number of NPN field-effect transistors $T_1$ and $T_2$ are formed in p-type wafer 1; transistors $T_1$ and $T_2$ each normally exhibit depletion mode operation and, for example, a same voltage threshold $V_t$. To tailor individually the operating characteristics, for example, of field-effect transistor $T_1$, portion *7a* of insulating layer 7 is removed from over the corresponding conduction channel 17; when the operating characteristics, for example, of field-effect transistor $T_2$ are not to be affected, portion *7a* is maintained over the corresponding conduction channel 17. The structure of FIG. 2 is subjected to a short oxidation process to form insulating layer *7b*, at least, over conduction channel 17 of field-effect transistor $T_1$ and, also, any other field-effect transistors on wafer 1 whose operating characteristics are to be tailored. During such oxidation process, the respective thicknesses of insulating layer 7 and insulating layer 7*a* located over conduction channel 17 of field-effect transistor $T_2$ increase by a very small amount. Due to the thickness $d_1$ of insulating layer 7*a* as shown in FIG. 3B, e.g., 6,000 A, field-effect transistor $T_2$ may exhibit a threshold voltage of approximately −12 volts. When insulating layer 7*b* has been formed in a desired thickness *d*, e.g., 1,500 A., and prior to the metallization of conductors 13 and gate electrode 15, not shown, the structure of FIG. 2 is exposed to a gallium atmosphere while maintained at a selected diffusion temperature $T_d$, e.g., 800° C., by heater element 21. Prior to diffusion processes, field-effect transistor $T_1$ exhibits a threshold voltage of approximately −4 volts due to the thickness *d* of insulating layer 7*b*, approximately 1,500 A. Diffusion time $t_d$ is selected with respect to the thickness *d* of insulating layer 7*b* to provide a desired compensation of field-effect transistor $T_1$, e.g., a desired operational mode and, also, threshold voltage $V_t$ as hereinabove described. For example, diffusion time $t_d$ can be set at 4 hours to provide field-effect transistor $T_1$ a threshold voltage $V_t$ of approximately +1 volt (enhancement mode), the thickness *d* of insulating layer 7*a* over conduction channel 17 of field-effect transistor $T_2$ effectively masks the gallium whereby the operating characteristics of such transistor are unchanged. Accordingly, the field-effect transistor $T_1$ alone is irreversibly compensated whereas the field-effect transistor $T_2$ is unaffected due to the greater thickness of the silicon dioxide portion 7*a*.

Numerous modifications of the technique described with respect to FIG. 2 can be obtained. For example, portion 7*a* over conduction channel 17 of each of the field-effect transistors $T_1$ and $T_2$ can be stripped and reformed in a predetermined thickness such that, when subjected to the same diffusion parameters, the respective operating characteristics of the transistor are affected to different degrees. The degree of compensation of the surface of silicon wafer 1 underlying insulating layer 7*b* is proportional to the thickness *d* of such layer. Accordingly, the operating characteristics of field-effect transistors $T_1$ and $T_2$ can be concurrently tailored, the degree of tailoring being determined by the ratio of thicknesses *d* of insulating layer 7*b* formed thereover. Consider, for example, portions 7*a* over conduction channels 17 of transistors $T_1$ and $T_2$, respectively, have been stripped and insulating layer 7*b* is oxidized, layer 7*b* over field-effect transistor $T_2$ being of a greater thickness *d*, e.g., 2,500 A., than the thickness *d*, e.g., 1,500 A., of layer 7*b* over field-effect transistor $T_1$. During a same diffusion process and by proper determination of the relative thicknesses of insulating layer 7*b*, it is possible to alter the threshold voltage $V_t$ of each of the field-effect transistors $T_1$ and $T_2$. For example, and referring to FIG. 5A, by exposing the structure of FIG. 2 to a gallium atmosphere at 800° C. for approximately 3 hours, the operational mode of the field-effect transistor $T_1$ is converted to exhibit a threshold voltage $V_t$ of +1 volt (enhancement mode) while the threshold voltage $V_t$ of field-effect transistor $T_2$ is changed to −1 volt without change in the operational mode.

While the method of this invention has been described with respect to the compensation of a silicon surface wafer by gallium diffusion, it is evident to one skilled in the art that numerous other acceptor impurity materials are available, e.g., indium, which satisfy the standard hereinabove set forth, whereby surfaces of other elemental semiconductor materials, e.g., germanium can be similarly compensated. The impurity material should exhibit a relatively large diffusion constant through the insulating layer, a relatively small diffusion constant in the elemental semiconductor material, and possess a relatively large segregation coefficient *m* at the interface defined therebetween to allow passage of a sufficient number of impurity atoms to compensate the donor surface states. Moreover, diffusion of the acceptor impurity material should be effected through the insulating layer subsequent to high temperature processes such that positive control of the operating characteristics of the field-effect transistor is achieved.

While the invention has been particularly shown and described with reference to preferred embodiments thereof, it will be understood by those skilled in the art that various changes in form and details may be made therein without departing from the spirit and scope of the invention.

What is claimed is:

1. A method for forming an insulated-gate field-effect transistor comprising the steps of forming diffused spaced portions of a first conductivity type on the surface of a semiconductor wafer of opposite conductivity type, forming an insulating layer at least over that portion of said surface intermediate said diffused spaced portions and defining a conduction channel therebetween, the interface between said insulating layer and said intermediate portion of said wafer having a given surface potential, and forming a gate electrode over said insulating layer to apply electrical fields to said intermediate surface portion, the improvement comprising the step of diffusing an acceptor-type impurity material through said insulating layer and into a narrow layer of said intermediate surface portion prior to forming said gate electrode to control the surface potential at said intermediate surface portion.

2. The method of claim 1 wherein the improvement further includes diffusing a sufficient quantity of said acceptor type impurity material into said narrow layer to convert the operational mode of said field-effect transistor.

3. The method of claim 1 wherein said acceptor type impurity material is characterized as having a larger diffusion constant in said insulating layer than in said semiconductor wafer.

4. The method of claim 1 wherein said acceptor type impurity material is gallium.

5. A method for forming an insulated-gate field-effect transistor comprising the steps of:

forming diffused spaced portions of one conductivity type into a semiconductor wafer of opposite conductivity type, forming an insulating layer at least over that surface portion of said wafer intermediate said diffused spaced portions and defining a conduction channel therebetween, the interface between said insulating layer and said surface portion having a particular surface potential defined by the character of said interface, diffusing an acceptor-type impurity material through said insulating layer and into said intermediate surface portion to control the surface potential at said interface, and forming field-applying means over said insulating layer to apply electrical fields to said surface portion, said field-applying means being formed subsequent to the diffusion of said impurity material into said surface portion.

6. The method of claim 5 wherein said diffused spaced portions are of p-type conductivity and said wafer is of n-type conductivity.

7. The method of claim 5 wherein said diffused spaced portions are of n-type conductivity and said wafer is of p-type conductivity.

8. A method for forming an insulated-gate, field-effect transistor comprising the steps of:

forming diffused spaced portions of one conductivity type into the surface of a silicon wafer of opposite conductivity type, said diffused space portions defining source and drain electrodes, forming a silicon dioxide insulating layer at least over that portion of said surface intermediate said diffused source and drain electrodes, the interface between said insulating layer and said intermediate surface portion having a surface potential defined by the character of said interface, exposing the resulting structure to an atmosphere of an acceptor-type impurity at an elevated temperature and for a time sufficient to cause said acceptor-type impurity to diffuse through said insulating layer and to control said surface potential, and subsequently forming a gate electrode over said insulating layer for applying fields to said intermediate surface portion.

9. A method of forming an insulated-gate, field-effect transistor in the surface of a silicon wafer of first conductivity type comprising the steps of:

genetically forming a first insulating layer over said surface, the interface between said surface and said layer having a given surface potential, defining a diffusion mask in said first insulating layer to expose selected portions of said surface, diffusing a first impurity material in said exposed surface portions to form said source and drain electrodes of second conductivity type, said insulating layer effectively masking said first impurity material, stripping portions of said insulating layer to expose portions of said surface intermediate said source and drain electrodes, genetically forming a second insulating layer over said intermediate surface portions, diffusing acceptor-type impurity material through said second insulating layer and into a narrow layer of said intermediate surface portion, said acceptor-type impurity material characterized as having a larger diffusion constant in silicon dioxide than in silicon, controlling the diffusion of said acceptor-type impurity material to provide a desired surface potential at said interface, and forming a gate conductor over said second insulating layer and registered with said intermediate surface portions.

10. The method of claim 9 wherein said acceptor-type impurity is gallium and including the further step of elevating said silicon wafer to a temperature selected between 650° C. and 1250° C. for a time sufficient to provide said desired surface potential at said interface.

11. The method of claim 10 comprising the further step of maintaining said silicon wafer at said selected temperature for a time sufficient to convert the operational mode of said field-effect transistor.

12. A method for forming a field-effect transistor in a silicon surface of first conductivity type comprising the steps of:

diffusing source and drain electrodes of second conductivity type into said surface, genetically forming an insulating layer of silicon dioxide over said surface intermediates said source and drain electrodes, exposing the resulting structure to an acceptor-type impurity atmosphere, said acceptor-type impurity having a larger diffusion constant in silicon dioxide than in silicon, elevating said structure to a selected temperature between 650° C. and 1250° C. whereby said acceptor-type impurity diffuses through said insulating layer and into said surface, maintaining said structure at said selected temperature for a time sufficient to compensate donor surface states at the interface defined between said insulating layer and said surface whereby said field-effect transistor exhibits a desired threshold voltage, and subsequently metallizing a gate electrode on said insulating layer and registered with said surface intermediate said source and drain electrodes.

13. The method of claim 12 including the further step of continuing said silicon body at said selected temperature for a time sufficient to convert the operational mode of said field-effect transistor.

14. A method for individually tailoring the operating characteristics of field-effect transistors formed on a silicon surface comprising the steps of:

diffusing spaced portions of one conductivity type into the surface of a silicon body of opposite conductivity type, said diffused portions defining source and drain electrodes, forming a first silicon dioxide layer over portions of said surface intermediate first pairs of said diffused portions and a second silicon dioxide layer of larger thickness over portions of said surface intermediate second pairs of said diffused portions, the interfaces defined between said surface and said first and said second layers, respectively, having characteristics surface potentials, exposing the resulting structure to an acceptor-type impurity atmosphere at an elevated temperature and for a time sufficient to cause said acceptor-type impurity material to diffuse through said first layer and into said surface to control the surface potential at said interface defined therebetween, and subsequently metallizing gate electrodes over said first and said second layers and registered with said surface portions intermediate said pairs of diffused portions.

15. The method of claim 14 including the further step of exposing said structure for a time sufficient to cause said acceptor-type impurity to diffuse through said first and said second layers and into said surface to control the surface potentials at said interfaces defined therebetween to different degrees.

16. A method for individualy tailoring the operating characteristics of insulated-gate, field-effect transistors formed on a silicon wafer comprising the steps of:

subjecting said silicon wafer to first oxidation process to genetically form a first silicon dioxide layer over the surface of said wafer, exposing selected portions of said surface through said first layer to define a desired source-drain pattern mask for said field-effect transistors, diffusing source and drain electrodes in said selected surface portions and through said pattern mask, said source and drain electrodes and said silicon wafer being of opposite conductivity types, stripping portions of said first layer to expose portions of said surface intermediate source and drain electrodes of particular field-effect transistors whose operating characteristics are to be tailored, said intermediate surface portions defining conduction channels for said field-effect transistors, subjecting the resulting structure to a second oxidation process to genetically form a second silicon dioxide layer of lesser thickness than said first layer over said selected surface portions and said intermediate surface portions, exposing the resulting structure to a gaseous atmosphere of an acceptor-type impurity material at an elevated temperature and for a time sufficient to cause said impurity to diffuse through said second layer, controlling the diffusion of said impurity material through said second layer to provide a desired doping of said conduction channels of said particular field-effect transistors whereby the operating characteristics are tailored, and subsequently forming field-applying means over said first and said second layers and registered with said conduction channels of said field-effect transistors.

17. The method of claim 16 including the further steps of:

forming said first and said second layers to have selected thickness whereby said conduction channels underlying each are doped to different levels, and further continuing said structure at said elevated temperature for a time sufficient to cause said impurity material to diffuse through said first and said second layers.

18. The method of claim 16 wherein said impurity material is gallium and said elevated temperature is selected between 650° C. and 1250° C.

19. A method for individually tailoring the operating characteristics of insulated-gate, field-effect transistors formed on a silicon wafer of first conductivity type comprising the steps of:

forming a first silicon dioxide layer on the surface of said wafer, etching said first layer over selected portions of said surface to define a source-drain diffusion mask for said field-effect transistors, diffusing source and drain electrodes of second conductivity type in said selected portions of said surface, etching said first layer over portions of said surface intermediate said source and drain electrodes of particular field-effect transistors, forming a second silicon dioxide layer of predetermined thickness over exposed surface portions, exposing the resulting structure to an atmosphere of an acceptor-type impurity material at an elevated temperature between 650° C. and 1250° C., said impurity material exhibiting a larger diffusion constant in silicon dioxide than in silicon, controlling the duration of diffusion of said impurity material through said second layer to provide desired operating characteristics for said particular field-effect transistors, and subsequently metallizing gate electrodes over said first and said second layers and registered with portions of said surface intermediate said source and drain electrodes of said field-effect transistors.

20. The method of claim 19 comprising the further step of forming said first layer in sufficient thickness to effectively mask said impurity material whereby underlying surfaces of said silicon wafer are undoped.

References Cited

UNITED STATES PATENTS

| | | | |
|---|---|---|---|
| 3,102,230 | 8/1963 | Kahng. | |
| 3,183,129 | 5/1965 | Tripp | 148—187 X |
| 3,203,840 | 8/1965 | Harris. | |
| 3,226,611 | 12/1965 | Haenichen | 317—234 |
| 3,226,613 | 12/1965 | Haenichen | 317—234 |

WILLIAM I. BROOKS, *Primary Examiner.*

U.S. Cl. X.R.

29—578; 148—187; 317—235